United States Patent
Liu et al.

(10) Patent No.: US 10,074,969 B2
(45) Date of Patent: Sep. 11, 2018

(54) TRAVELLING WAVE PROTECTION OF A TRANSMISSION LINE

(71) Applicant: ABB Schweiz AG, Baden (CH)

(72) Inventors: Kai Liu, Beijing (CN); Jianping Wang, Västerås (SE); YouYi Li, Västerås (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/558,894

(22) PCT Filed: Mar. 30, 2015

(86) PCT No.: PCT/EP2015/056922
§ 371 (c)(1),
(2) Date: Sep. 15, 2017

(87) PCT Pub. No.: WO2016/155778
PCT Pub. Date: Oct. 6, 2016

(65) Prior Publication Data
US 2018/0069391 A1     Mar. 8, 2018

(51) Int. Cl.
*H02H 3/00* (2006.01)
*H02H 3/28* (2006.01)
*H02H 7/26* (2006.01)
*G01R 31/08* (2006.01)

(52) U.S. Cl.
CPC .............. *H02H 3/28* (2013.01); *H02H 7/262* (2013.01); *H02H 7/263* (2013.01); *H02H 7/265* (2013.01); *G01R 31/08* (2013.01); *G01R 31/085* (2013.01)

(58) Field of Classification Search
USPC ...................................... 361/61–69
See application file for complete search history.

(56) References Cited

U.S. PATENT DOCUMENTS

| 4,106,085 | A | * | 8/1978 | Demarest | H02J 3/36 363/51 |
| 4,351,011 | A | | 9/1982 | Liberman | |
| 4,499,417 | A | * | 2/1985 | Wright | G01R 31/088 324/522 |
| 7,221,166 | B2 | | 5/2007 | Saha et al. | |

(Continued)

FOREIGN PATENT DOCUMENTS

| CN | 102122815 A | 7/2011 |
| CN | 102122815 B | 5/2014 |

(Continued)

OTHER PUBLICATIONS

Chamia M et al: "Ultra High Speed Relay for EHV/UHV Transmission Lines—Development,Design and Appli cation", IEEE Transactions on Power Apparatus and Systems, IEEE Inc. New York, US, vol. PAS-97, No. 6, Nov. 1, 1978 (Nov. 1, 1978), pp. 2104-2116.

(Continued)

*Primary Examiner* — Danny Nguyen
(74) *Attorney, Agent, or Firm* — Whitmyer IP Group LLC

(57) ABSTRACT

A mechanism for travelling wave protection of a transmission line and a method for acquiring information of both voltage and current polarities from two ends of a transmission line. The method includes comparing the voltage and current polarities of both ends of the transmission line to each other. The method also includes making a trip decision based on the comparison.

17 Claims, 4 Drawing Sheets

(56) References Cited

U.S. PATENT DOCUMENTS

| | | |
|---|---|---|
| 8,655,609 B2 | 2/2014 | Schweitzer, III et al. |
| 2016/0077149 A1* | 3/2016 | Schweitzer, III .. G01R 31/2836 307/131 |

FOREIGN PATENT DOCUMENTS

| | | |
|---|---|---|
| WO | 7900657 A1 | 9/1979 |
| WO | 2009095040 A1 | 8/2009 |
| WO | 2014053174 A1 | 4/2014 |

OTHER PUBLICATIONS

International Preliminary Report on Patentability Application No. PCT/EP2015/056922 Completed Date: Feb. 27, 2017 5 pages.
International Search Report & Written Opinion of the International Searching Authority Application No. PCT/EP2015/056922 Completed Date: Sep. 16, 2015; dated Sep. 25, 2015 11 pages.

* cited by examiner (a)

| A | | B | |
|---|---|---|---|
| Δu | Δi | Δu | Δi |
| + | + | + | + |
| + | + | + | - |
| + | + | - | - |
| + | + | - | + |
| + | - | + | + |
| + | - | + | - |
| + | - | - | - |
| + | - | - | + |
| - | + | + | + |
| - | + | + | - |
| - | + | - | - |
| - | + | - | + |
| - | - | + | + |
| - | - | + | - |
| - | - | - | - |
| - | - | - | + |

(b)

| A | | B | |
|---|---|---|---|
| Δu | Δi | Δu | Δi |
| + | + | + | + |
| + | + | + | - |
| + | + | - | - |
| + | + | - | + |
| + | - | + | + |
| + | - | + | - |
| + | - | - | - |
| + | - | - | + |
| - | + | + | + |
| - | + | + | - |
| - | + | - | - |
| - | + | - | + |
| - | - | + | + |
| - | - | + | - |
| - | - | - | - |
| - | - | - | + |

☐ Will not trip   ▦ Correct trip   ▨ Mal-trip

Fig. 4

TRAVELLING WAVE PROTECTION OF A TRANSMISSION LINE

TECHNICAL FIELD

Embodiments presented herein relate to travelling wave protection, and particularly to a method and an arrangement for travelling wave protection of a transmission line.

BACKGROUND

Consider a regional power system having a strong internal transmission system transmitting power to another strong regional system on relatively weak Interties. Such a regional power system may experience issues with stability during disturbances, such as short circuits, loss of generation, loss of load, loss of one of the Interties, or any combination thereof. Prevalent practice to the solution of these issues is to include more Interties, increase the voltage to higher voltage levels (such as extra high voltage (EHV) levels or ultra high voltage (UHV) levels), or both. Another approach for better power system stability is to employ protection relays with high operation speed.

Travelling wave protection is one approach for super-high speed protection. There are different types of travelling wave protections, for example, travelling wave pilot protection based on directional comparison, travelling wave current differential protection, travelling wave protection based on distance measurements, etc.

In general terms, directional pilot protection enables a practical and reliable mechanism for travelling wave protection. It only needs a small bandwidth channel to transmit binary information between terminals at end points of a transmission line. Directional pilot protection can detect the fault direction based on local measurements, which can block the mal-trip on external fault in reverse direction even with wrong communication.

Travelling wave protection based on directional comparison has e.g., been presented in "Ultra High Speed Relay for EHV/UHV Transmission Lines'—Development, Design and Application" by M. Chamia and S. Liberman in IEEE Transactions on Power Apparatus and Systems, Vol. PAS-97, No. 6, November/December 1978. In general terms, in such protection system, the voltage and current at both ends of the protected line are measured. The direction of the local voltage and current measurements is detected. A trip decision is made based on a comparison of the directions of both ends.

In more detail, in travelling wave protection based on directional comparison the polarities of the first wave fronts of local voltage and current are compared. If they are the same, a backward fault has occurred. If they are reverse, a forward fault has occurred. Then the protection relays at the two terminals will transmit the fault direction to the other terminal. If both directions are forward directions, an internal fault has occurred. Otherwise, an external fault has occurred. Its basic principle is shown in FIG. 2.

One issue with the above disclosed travelling wave protection based on directional comparison is the presence of harmonics. A low pass filter and some band stop filters are used in above disclosed travelling wave protection based on directional comparison to filter the travelling wave components. In modern power system, with more and more flexible alternating current transmission systems (FACTS), high-voltage direct current (HVDC), and other harmonic resource, the harmonics are complex and may be sub-harmonics. It may be difficult, or even impossible, to remove all the harmonics by pre-setting band stop filters. As a result, the harmonics may be treated as travelling wave, which may lead to mal-trips in some cases when such false travelling waves indicate wrong forward fault directions from both ends.

Capacitive Voltage Transformers (CVTs) are widely used in EHV/UHV systems as voltage signal measurement sensors. But CVT does not have a flat frequency response, especially for high frequencies. This leads to measurement errors, which can be big, for fault transient detection. For current travelling waves, it may be easy to avoid harmonic impact by using high-frequency current. But for voltage travelling waves, because of the generally bad frequency response of CVTs, only relatively low frequency value are available (e.g., <1 kHz). This means that voltage may be influenced by harmonics more seriously. As a result, the polarity of voltage travelling wave detected may be wrong in some cases. Thereby, reverse faults may be treated as forward faults, which may lead to a mal-trip in some cases.

CN102122815 A provides a traveling wave direction pilot protection method. The directional detection is based on a current travelling wave (including high frequency components) and a fundamental frequency voltage (50 Hz or 60 Hz). This method can avoid the influence from voltage harmonics by using fundamental frequency voltage. But the usage of low frequency components also slows down the operate speed. In addition, this method is based on directional comparison. A possible erroneous detection of voltage polarity caused by other reasons except the harmonics may still bring a risk of mal-trip.

However, there is still a need for an improved protection of a transmission line, for example to provide improved travelling wave protection which can reduce the risk of mal-trip even when the detection of voltage polarity is wrong.

SUMMARY

An object of embodiments herein is to provide efficient protection of a transmission line.

According to a first aspect there is presented a method for travelling wave protection of a transmission line. The method comprises acquiring information of both voltage and current polarities from two ends of a transmission line. The method comprises comparing the voltage and current polarities of both ends of the transmission line to each other. The method comprises making a trip decision based on the comparison.

Advantageously this provides efficient protection of a transmission line.

Advantageously this provides improved travelling wave protection which can reduce the risk of mal-trip even when the detection of voltage polarity is wrong.

Advantageously this enables an internal fault detection to be based on a 4-polarity comparison instead of a 2-direction comparison. This will enhance the security and reliability of the protection.

Advantageously this provides high speed protection of a transmission line which could be used in existing Intelligent Electronic Devices (IEDs).

According to a second aspect there is presented an arrangement for travelling wave protection of a transmission line. The arrangement comprises a processing unit. The processing unit is configured to cause the arrangement to acquire information of both voltage and current polarities from two ends of a transmission line. The processing unit is configured to cause the arrangement to compare the voltage and current polarities of both ends of the transmission line to each other. The processing unit is configured to cause the arrangement to make a trip decision based on the comparison.

According to a third aspect there is presented a computer program for travelling wave protection of a transmission line, the computer program comprising computer program code which, when run on a processing unit of an arrangement, causes the arrangement to perform a method according to the first aspect.

According to a fourth aspect there is presented a computer program product comprising a computer program according to the third aspect and a computer readable means on which the computer program is stored.

It is to be noted that any feature of the first, second, third and fourth aspects may be applied to any other aspect, wherever appropriate. Likewise, any advantage of the first aspect may equally apply to the second, third, and/or fourth aspect, respectively, and vice versa. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which:

FIG. 4 is a schematic diagram illustrating a comparison between (a) known travelling wave protection based on directional comparison and (b) travelling wave protection of a transmission line according to embodiments;

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

As noted above there are issues with existing mechanisms for travelling wave protection based on directional comparison. For example, only one binary information bit is exchanged between the terminals for the communication of existing pilot protections for each trip loop. The exchanged information can thus only have a binary meaning, such as either permit or block, or in other words forward fault or backward fault. This may lead to a mal-trip if one voltage polarity detection is wrong.

In some cases, if something wrong with the voltage detection, backward fault may be detected as forward fault, as a result, existing mechanisms for travelling wave protection (including CN102122815A) may mal-trip. The herein disclosed method and arrangement for travelling wave protection of a transmission line will not mal-trip for such cases. Such mal-trip cases of existing mechanisms are in FIG. 4(*a*) identified as mal-trips.

In existing mechanisms for travelling wave protection, as exemplified by CN102122815A, the fault direction is first detected, and then direction information of the detected fault is transmitted to a remote terminal for processing by final fault detection logics. In contrast, according to the herein disclosed embodiments, both voltage polarity and current polarity are sent to the remote end for processing by final fault detection logics.

The herein disclosed embodiments overcome the above mentioned issues by providing travelling wave pilot protection based on a 4-polarity comparison. According to one aspect, this is enabled by transmitting information of both voltage and current polarities between ends (instead of only transferring fault direction). A trip decision can then be made based on this 4-polarity comparison.

Figure 7:
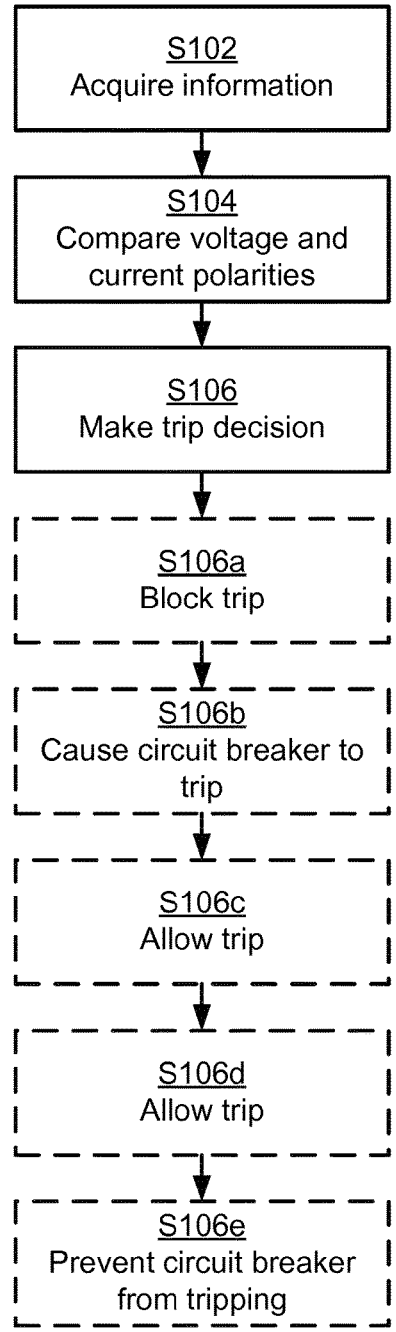
FIG. 7 is a flowchart of methods according to embodiments.

Hence, there is provided a method for travelling wave protection of a transmission line. Reference is now made to the flowchart of FIG. 7. The method comprises acquiring information, step S102, of both voltage and current polarities from two ends of a transmission line. The method comprises comparing, step S104, the voltage and current polarities of both ends of the transmission line to each other. The method comprises making a trip decision, step S106, based on the comparison.

Embodiments relating to further details of the herein disclosed method and arrangement for travelling wave protection of a transmission line will now be disclosed.

There may be different ways to execute the trip decision. According to an embodiment the trip decision relates to whether or not to cause a circuit breaker to trip.

There may be different ways to make the trip decision. Different embodiments relating thereto will now be described in turn.

According to an embodiment, making the trip decision comprises, step S106*a*, blocking a trip. The trip is blocked if certain conditions are fulfilled. These conditions are that the voltage polarities from the two ends differ, that the current polarities from the two ends differ, and that any of the voltage polarities are the same as the current polarities. Further, blocking the trip may comprise, step S106*b*, causing the circuit breaker to trip. The circuit breaker may be caused to trip by a control command being issued.

According to an embodiment, making the trip decision comprises, step S106*c*, allowing a trip. The trip is allowed only if certain conditions are fulfilled. These conditions are that the voltage polarities from the two ends are the same, that the current polarities from the two ends are the same, and that the voltage polarities differ from the current polarities.

The transmission line may be a multi-terminal transmission line having more than two ends For example, for each trip loop, there may be a 4-polarity comparison instead of a 2-direction comparison. But there may be more than one trip loop. For example, the comparison may be separated in phase. For each line there are 3 (A, B, C phase) loops, and for each loop, there are 4-polarities. For a multi-terminal transmission line, there may even be more than 4 polarities. For example, for a 2-end line, there are 4-polarites, for a 3-end line, there are 6-polarites, and for a 4-end line, there are 8-polarities for each loop.

According to an embodiment, making the trip decision comprises, step S106d, allowing a trip for the multi-terminal transmission line having more than two ends. The trip is allowed only if certain conditions are fulfilled. These conditions are that the voltage polarities from all ends are the same and the current polarities from all ends are the same and that the voltage polarities differ from the current polarities.

Further, allowing the trip may comprise, step S106e, preventing the circuit breaker from tripping.

There may be different ways to acquire the information in step S102. Different embodiments relating thereto will now be described in turn. For examples, the voltage and current polarities may be exchanged between the ends of the transmission line. That is, according to an embodiment, the information of both voltage and current polarities from two ends of the transmission line is exchanged between the two ends of the transmission line. Protective relays may be placed at the ends of the transmission line. That is, according to an embodiment, the information of voltage and current polarities is acquired from protective relays, one protective relay being placed at each end of the transmission line.

There may be different properties on which the comparison the comparison is based. For example, the comparison may be based on phase quantity, phase-phase quantity, differential mode, common mode, zero mode, or any combination thereof.

There may be different ways to determine when to measure the voltage and current polarities. Different embodiments relating thereto will now be described in turn. According to one embodiment, the voltage and current polarities are measured at both of the two ends of the transmission line (just) prior to the information being acquired. Hence, this may enable only the recent most voltage and current polarities to be considered when making the trip decision in step S106. Particularly, voltage and current polarities may be measured at both of the ends of the transmission line within a certain time interval. This may ensure that the voltage and current polarities are measured at the same time (or at least within the certain time interval from each other) at both of the ends of the transmission line.

There may be different types of transmission line to which the travelling wave protection may be applied. Different embodiments relating thereto will now be described in turn. For example, the transmission line may be part of a power distribution system. The transmission line may either be an alternating current (AC) transmission line or a direct current (DC) transmission line.

Figure 1:
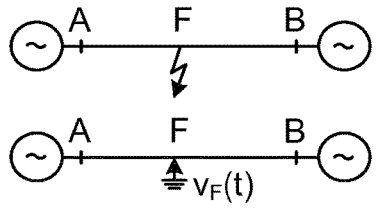
FIG. 1 is a schematic diagram illustrating principles of known travelling wave protection based on directional comparison.
Figure 2:
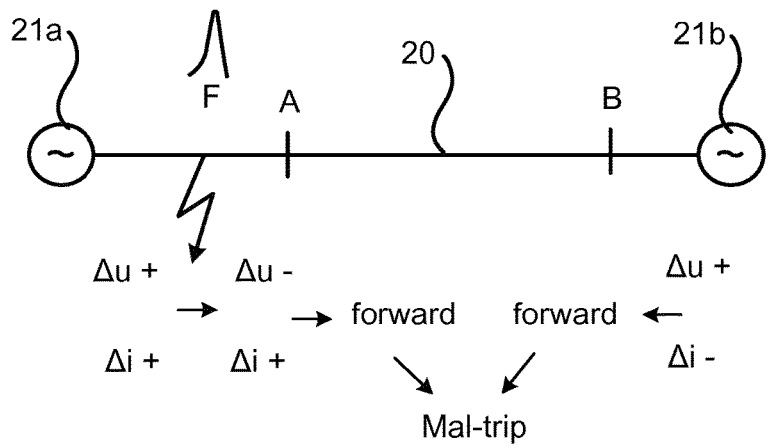
FIG. 2 is a schematic diagram illustrating principles of known travelling wave protection based on directional comparison.
Figure 3:
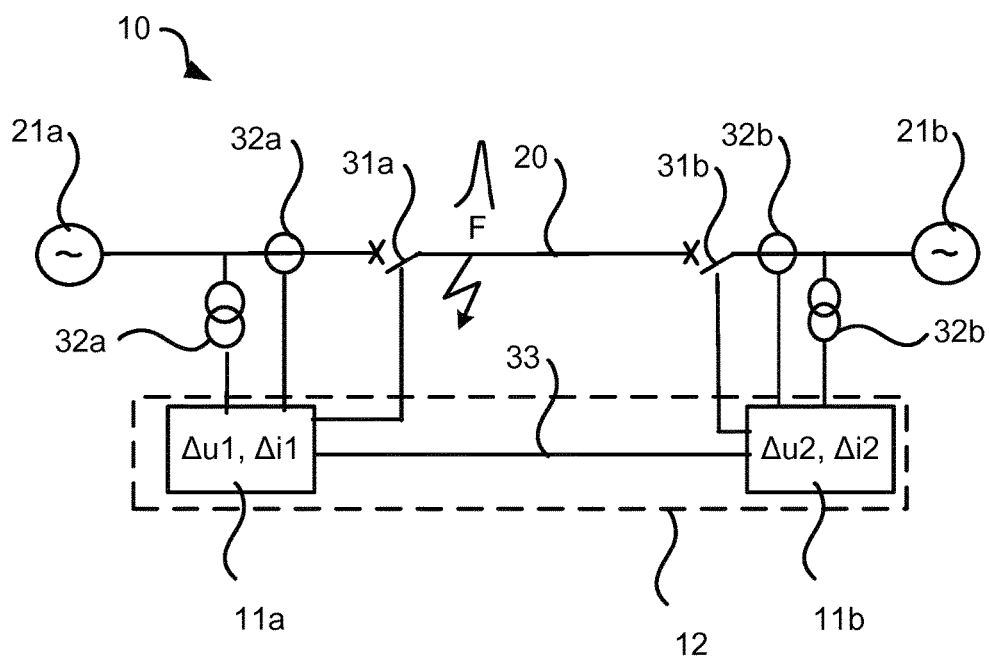
FIG. 3 is a schematic diagram illustrating travelling wave protection of a transmission line according to embodiments.

Reference is now made to FIGS. 2 and 3. FIG. 2 schematically illustrates known travelling wave protection of a transmission line 20 between a first power source 21a and a second power source 21b and where a fault F occurs, causing the polarity of Δu to change from + to −, thereby causing a mal-trip.

FIG. 3 schematically illustrates logics of how to block a potential mal-trip according to embodiments disclosed herein. The power system 10 of FIG. 3 comprises power sources 21a, 21b, current transformers 32a, 32b, voltage transformers 32a, 32b, circuit breakers 31a, 31b, and electronic devices 11a, 11b. The electronic devices 11a, 11b are part of an arrangement 12. Polarities of Δu1, Δu2, Δi1, Δi2 can be communicated via communication link 33. For a fault F in the transmission line 20 the measured Δu1, Δu2 should have the same polarity. Electronic device 11a can send the polarity information of Δu1, Δi1 to electronic device 11b, and electronic device 11b can send the polarity information of Δu2, Δi2 to electronic device 11a. Each electronic device 11a, 11b may be an intelligent electronic device (IED) operating as a relay.

One of the correct polarity combinations of voltage and current waves at the two terminals, for an external fault at point F, is provided in the example of Table 1 below. Thus, in this illustrative example Δu and Δi have the same polarities for one end (Side A). The protection mechanism at Side A can thus detect a backward fault based on travelling wave theory. Travelling wave theory is as such known in the art, as exemplified by the above referenced document "Ultra High Speed Relay for EHV/UHV Transmission Lines'—Development, Design and Application" and further description thereof is therefore omitted.

For Side B, Δu and Δi have, according to the illustrative example, the reverse polarities. Thus the protection at Side B can detect the forward direction. Finally, after the two pieces of direction information has been exchanged, the protection mechanism can detect an external fault. This is the normal and correct condition, see Table 1.

TABLE 1

| Side A | | Side B | |
|---|---|---|---|
| Δu | Δi | Δu | Δi |
| + | + | + | − |

However, if the voltage polarity detection on Side A is wrong for some reason (e.g., due to harmonics), the polarity of the voltage on Side A may be reversed (according to the illustrative example: Δu is negative). This is shown in Table 2.

TABLE 2

| Side A | | Side B | |
|---|---|---|---|
| Δu | Δi | Δu | Δi |
| − | + | + | − |

Based on the voltage polarity detection (not considering the current polarity detection) in Table 2, both sides (Side A and Side B) will detect a forward fault. As a result, known pilot protection mechanisms will treat it as an internal fault which will lead to a mal-trip, as in FIG. 2.

As disclosed above, according to the herein disclosed embodiments, the polarity information of both Δu and Δi will be considered when making a trip decision, as in FIG. 3. This means that each protective relay (i.e., the protective relay at each end of the transmission line) may have access to the complete 4-polarity information as shown in Table 2. The polarity of Δu should be the same for both internal faults and external faults for the same event. Thus, according to the herein disclosed embodiments the measurement error of Δu in Table 2 can be detected. The potential mal-trip will be blocked. By this means, the herein disclosed embodiments improve the protection reliability.

FIG. 4 is a schematic diagram illustrating a comparison between (a) known travelling wave protection based on directional comparison and (b) travelling wave protection of a transmission line according to embodiments. There are $2^4=16$ combinations of the 4 polarities of Δu and Δi from two terminals as shown in FIG. 4. The herein disclosed embodiments can block the mal-trip of the two previously unreasonable combinations (i.e., the mal-trips identified in FIG. 4(a)).

Figure 5A:
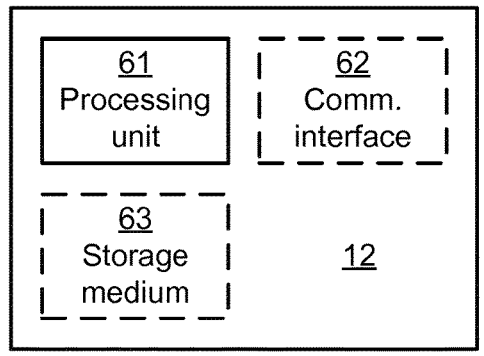
FIG. 5*a* is a schematic diagram showing functional units of an arrangement according to an embodiment.

FIG. 5a schematically illustrates, in terms of a number of functional units, the components of an arrangement 12 for travelling wave protection of a transmission line according to an embodiment. A processing unit 61 is provided using any combination of one or more of a suitable central processing unit (CPU), multiprocessor, microcontroller, digital signal processor (DSP), application specific integrated circuit (ASIC), field programmable gate arrays (FPGA) etc., capable of executing software instructions stored in a computer program product 71 (as in FIG. 6), e.g. in the form of a storage medium 63. Thus the processing unit 61 is thereby arranged to execute methods as herein disclosed. The storage medium 63 may also comprise persistent storage, which, for example, can be any single one or combination of magnetic memory, optical memory, solid state memory or even remotely mounted memory. The arrangement 12 may further comprise a communications interface 62. As such the communications interface 62 may comprise one or more transmitters and receivers, comprising analogue and digital components. The processing unit 61 controls the general operation of the arrangement 12 e.g. by sending data and control signals to the communications interface 62 and the storage medium 63, by receiving data and reports from the communications interface 62, and by retrieving data and instructions from the storage medium 63. Other components, as well as the related functionality, of the arrangement 12 are omitted in order not to obscure the concepts presented herein.

The arrangement 12 may be implemented in the electronic devices 11a, 11b. Hence, the electronic devices 11a, 11b may be configured to perform any step as herein disclosed. For example, each electronic device 11a, 11b may be configured to acquire information of both voltage and current polarities from its own (i.e., local) end and to acquire information of both voltage and current polarities from the other (i.e., remote) end from the other electronic device (over the communication link 33) in order to compare the voltage and current polarities to make a trip decision. Alternatively, the arrangement 12 is provided as a stand-alone device which interfaces the electronic devices 11a, 11b and where the standalone device is configured to acquire information from both ends of the transmission line in order to compare the voltage and current polarities to make a trip decision.

Figure 5B:
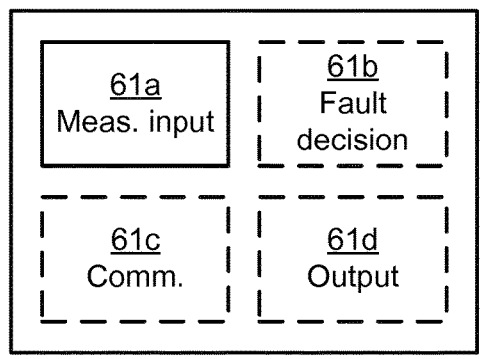
FIG. 5*b* is a schematic diagram showing functional modules of a protection device according to an embodiment.

FIG. 5b schematically illustrates, in terms of a number of functional modules, the components of an arrangement 12 embodied as a protection device according to an embodiment. The arrangement 12 of FIG. 5b comprises a number of functional modules; a measurement input module 61a, a fault decision module 61b, a communications module 61c, and an output module 61d.

The measurement input module 61a is configured to receive local measures of voltages and currents. The communications module 61c is configured to receive the polarities of voltages and currents from the remote end of the transmission line. The communications module 61c is configured to send the local polarities to the remote end. The fault decision module 61b implements logic to detect the fault based on any of the herein disclosed embodiments. The output module 61d is configured to send the trip decision to one or more circuit breakers.

In general terms, each functional module 61a-d may be implemented in hardware or in software. Preferably, one or more or all functional modules 61a-d may be implemented by the processing unit 61, possibly in cooperation with functional units 62 and/or 63. The processing unit 61 may thus be arranged to from the storage medium 63 fetch instructions as provided by a functional module 61a-d and to execute these instructions, thereby performing any steps as will be disclosed hereinafter.

Figure 6:
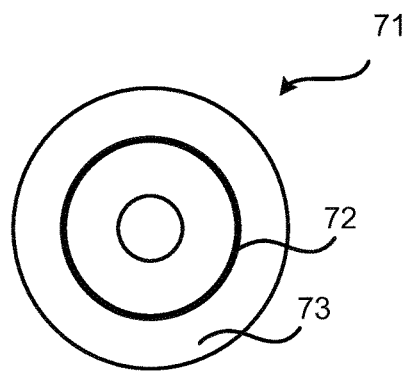
FIG. 6 shows one example of a computer program product comprising computer readable means according to an embodiment.

FIG. 6 shows one example of a computer program product 71 comprising computer readable means 73. On this computer readable means 73, a computer program 72 can be stored, which computer program 72 can cause the processing unit 61 and thereto operatively coupled entities and devices, such as the communications interface 62 and the storage medium 63, to execute methods according to embodiments described herein. The computer program 72 and/or computer program product 71 may thus provide means for performing any steps as herein disclosed.

In the example of FIG. 6, the computer program product 71 is illustrated as an optical disc, such as a CD (compact disc) or a DVD (digital versatile disc) or a Blu-Ray disc. The computer program product 71 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 72 is here schematically shown as a track on the depicted optical disk, the computer program 72 can be stored in any way which is suitable for the computer program product 71.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A method for travelling wave protection of a transmission line based on information of both voltage and current polarities, the method comprising:
acquiring information of both voltage and current polarities from two ends of a transmission line;
comparing the voltage and current polarities of a first end of the two ends to the voltage and current polarities of a second end of the two ends; and
making a trip decision based on the comparison, wherein making the trip decision comprises blocking a trip if the voltage polarities from the two ends differ and the current polarities from the two ends differ, and if any of the voltage polarities are the same as the current polarities.

2. The method according to claim 1, wherein the trip decision relates to whether or not to cause a circuit breaker to trip.

3. The method according to claim 1, wherein making the trip decision comprises:
allowing a trip only if the voltage polarities from the two ends are the same and the current polarities from the two ends are the same and if the voltage polarities differ from the current polarities.

4. The method according to claim 1, wherein the transmission line is a multi-terminal transmission line having more than two ends, and wherein making the trip decision comprises:
allowing a trip only if the voltage polarities from all ends are the same and the current polarities from all ends are the same and if the voltage polarities differ from the current polarities.

5. The method according to claim 1, wherein the information of both voltage and current polarities from the two ends of the transmission line is exchanged between the two ends of the transmission line.

6. The method according to claim 1, where the comparison is based on at least one of phase quantity, phase-phase quantity, differential mode, common mode, zero mode.

7. The method according to claim 1, wherein the voltage and current polarities are measured at both the two ends of the transmission line prior to the information being acquired.

8. The method according to claim 7, wherein voltage and current polarities are measured at both the ends of the transmission line within a certain time interval.

9. The method according to claim 1, wherein the transmission line is part of a power distribution system.

10. The method according to claim 1, wherein the transmission line is an alternating current, AC, transmission line.

11. The method according to claim 1, wherein the transmission line is a direct current, DC, transmission line.

12. The method according to claim 1, wherein the information of voltage and current polarities is acquired from protective relays, one protective relay being placed at each end of the transmission line.

13. An arrangement for travelling wave protection of a transmission line based on information of both voltage and current polarities, the arrangement comprising a processing unit, the processing unit being configured to cause the arrangement to:
acquire information of both voltage and current polarities from two ends of a transmission line;
compare the voltage and current polarities of a first end of the two ends to the voltage and current polarities of a second end of the two ends; and
make a trip decision based on the comparison, wherein making the trip decision comprises blocking a trip if the voltage polarities from the two ends differ and the current polarities from the two ends differ, and if any of the voltage polarities are the same as the current polarities.

14. The arrangement according to claim 13, wherein the arrangement comprises at least one protective relay placed at one of the ends of the transmission line.

15. The arrangement according to claim 13, wherein the arrangement comprises two protective relays, one protective relay being placed at each end of the transmission line.

16. The arrangement according to claim 14, wherein the each protective relay is part of an Intelligent Electronic Device, IED.

17. The arrangement according to claim 15, wherein the each protective relay is part of an Intelligent Electronic Device, IED.

* * * * *